United States Patent [19]
Mori

[11] Patent Number: 5,657,271
[45] Date of Patent: Aug. 12, 1997

[54] NONVOLATILE SEMICONDUCTOR MEMORY DEVICE IN WHICH BAND TO BAND TUNNELING CURRENT IS SUPPRESSED

[75] Inventor: Seiichi Mori, Tokyo, Japan

[73] Assignee: Kabushiki Kaisha Toshiba, Kawasaki, Japan

[21] Appl. No.: 682,892

[22] Filed: Jul. 12, 1996

[30] Foreign Application Priority Data

Jul. 13, 1995 [JP] Japan ................... 7-176968

[51] Int. Cl.$^6$ .................................................. G11C 16/06
[52] U.S. Cl. ................. 365/185.27; 365/185.18; 365/185.29; 365/185.33
[58] Field of Search .................. 365/185.27, 185.18, 365/185.29, 185.33, 189.09, 189.11, 218; 327/534

[56] References Cited

U.S. PATENT DOCUMENTS

| | | | |
|---|---|---|---|
| 5,361,235 | 11/1994 | Kodama | 365/218 |
| 5,457,652 | 10/1995 | Brahmbhatt | 365/185.06 |
| 5,561,620 | 10/1996 | Chen et al. | 365/218 |

OTHER PUBLICATIONS

IEEE Transactions On Electron Devices, vol. 42, No. 1, pp. 150–159, Jan. 1995.
1991 Symposium On VLSI Technology, JSAP Cat. No. AP911210, IEEE Cat. No. 91 CH 3017, pp. 77–78, May 28–30, 1991, Hitoshi Kume et al.
1992 IEEE International Solid–State Circuits Conference, IEEE Cat. No. 92CH3128-6, pp. 154–155, Feb., 1992, Toshikatsu Jinbo et al.

*Primary Examiner*—David C. Nelms
*Assistant Examiner*—Andrew Q. Tran
*Attorney, Agent, or Firm*—Banner & Witcoff, Ltd.

[57] ABSTRACT

A reliable Flash EPROM in which a band-to-band tunneling current is suppressed. A memory cell is formed on a double well structure region. A second impurity region of a first conductivity type formed in a first impurity region of a second conductivity type on a semiconductor substrate of the first conductivity type. A gate oxide film, a floating gate, an insulating film and a control gate are laminated in this order on a surface of the second impurity region, thereby forming a laminated gate. Source and drain regions are formed in a surface region of the second impurity region with the laminated gate interposed therebetween. The EPROM comprises a voltage supply system to suppress a band-to-band tunneling current. To discharge the floating gate, the semiconductor substrate is grounded and a potential difference between one of the source and drain regions and the second impurity region of the first conductivity type is controlled to be greater than 0 V and smaller than 2.5 V.

12 Claims, 7 Drawing Sheets

→ DIRECTIONS OF MOVEMENT OF ELECTRON ⊖ AND HOLE ⊕

$V_{GS}$: GATE-SOURCE VOLTAGE

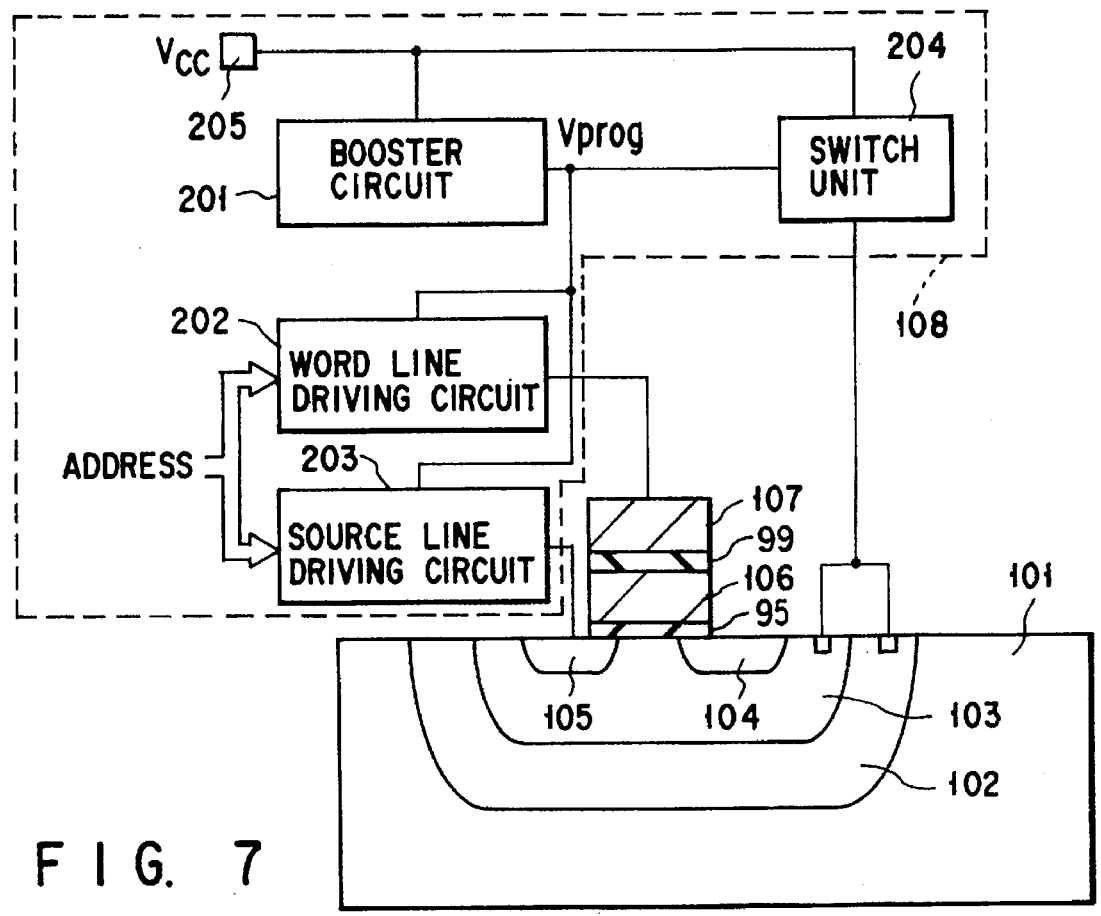
F I G. 7
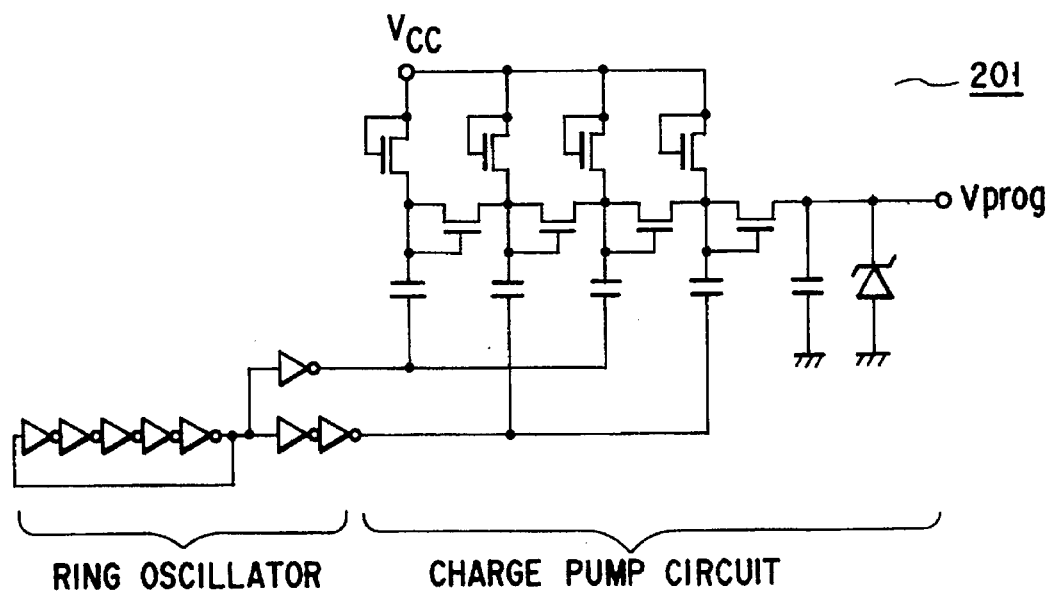
F I G. 8

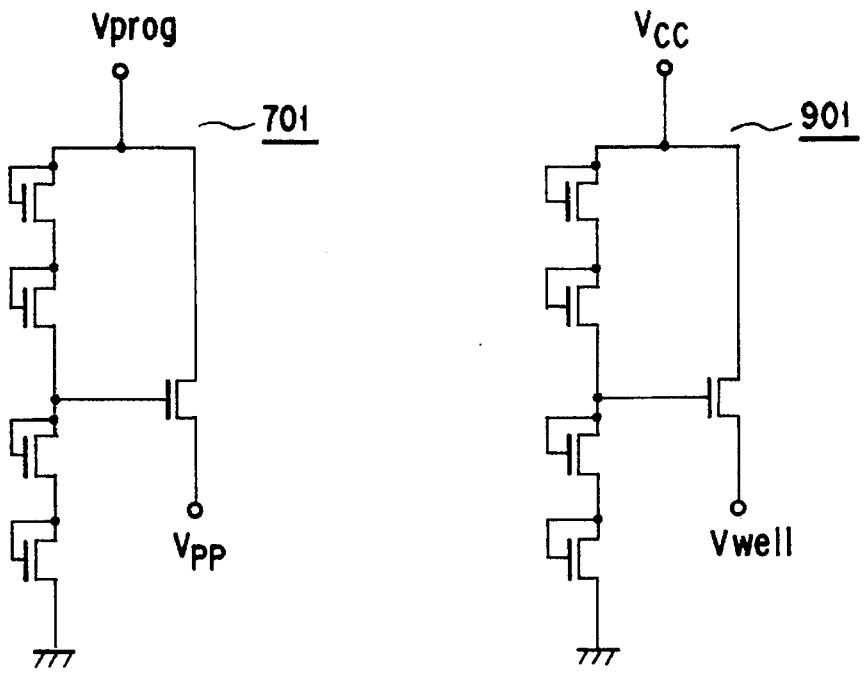
F I G. 13   F I G. 15
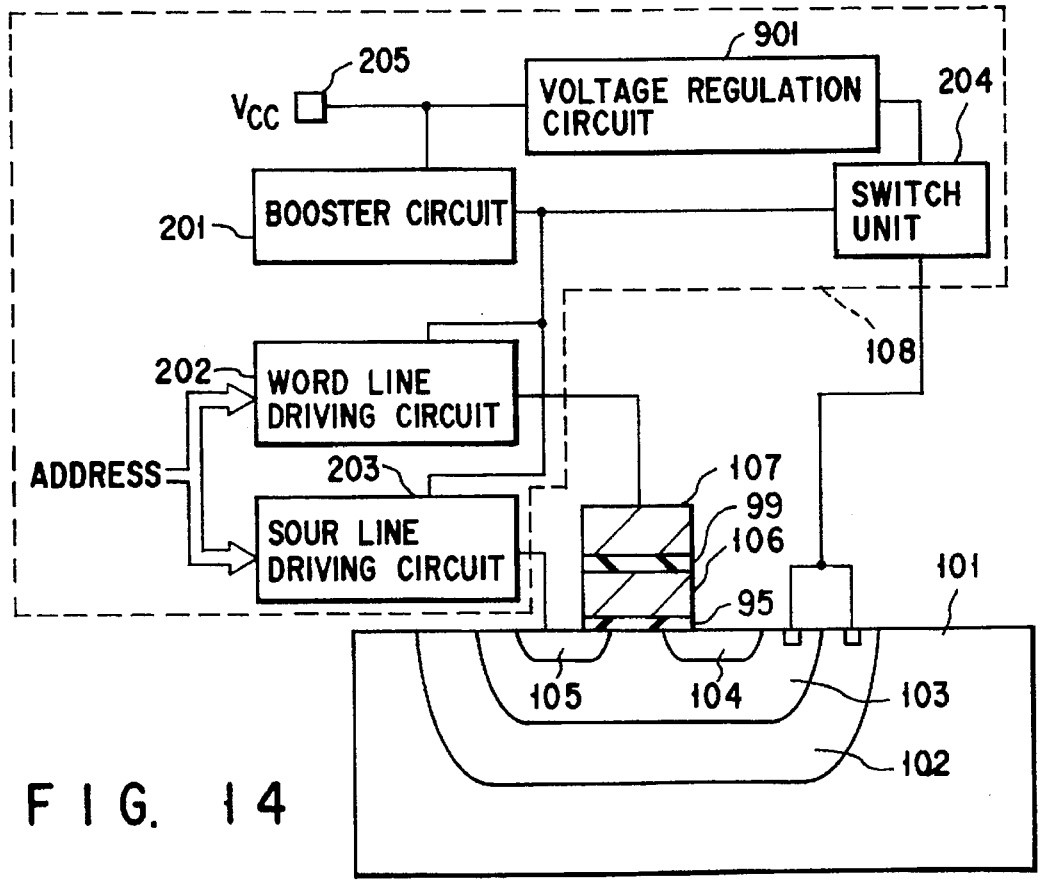
F I G. 14

| | EXTERNAL POWER SOURCE Vcc | SOURCE VOLTAGE Vpp | P-WELL VOLTAGE Vwell | GATE VOLTAGE Verase | POTENTIAL DIFFERENCE BETWEEN SOURCE AND P-well |
|---|---|---|---|---|---|
| EMBODI-MENT 1 | 3V | $V_{cc}$(3V) <br> ↓ <br> (BOOST) <br> ↓ <br> (REGULATION) <br> ↓ <br> 5V | $V_{cc}$(3V) | $V_{cc}$(3V) <br> ↓ <br> (BOOST) <br> ↓ <br> -10V | 2V |
| EMBODI-MENT 2 | 5V | $V_{cc}$(5V) | $V_{cc}$(5V) <br> ↓ <br> (REGULATION) <br> ↓ <br> 3V | $V_{cc}$(5V) <br> ↓ <br> (BOOST) <br> ↓ <br> -10V | 2V |
| EMBODI-MENT 3 | 5V | $V_{cc}$(5V) <br> ↓ <br> (BOOST) <br> ↓ <br> (REGULATION) <br> ↓ <br> 5V | $V_{cc}$(5V) <br> ↓ <br> (REGULATION) <br> ↓ <br> 3V | $V_{cc}$(5V) <br> ↓ <br> (BOOST) <br> ↓ <br> -10V | 2V |
| EMBODI-MENT 4 | 1.8V ($V_{cc}$1) <br> 3V ($V_{cc}$2) | $V_{cc}$1 (3V) | $V_{cc}$2 (1.8V) | $V_{cc}$(3V or 1.8V) <br> ↓ <br> (BOOST) <br> ↓ <br> -10V | 1.2V |

F I G. 16

NONVOLATILE SEMICONDUCTOR MEMORY DEVICE IN WHICH BAND TO BAND TUNNELING CURRENT IS SUPPRESSED

BACKGROUND OF THE INVENTION

1. Field of the Invention

The present invention relates to a nonvolatile semiconductor memory device, and particularly to a NOR type electrically Flash erasable and programmable read-only-memory (Flash EPROM) for extracting charges from a floating gate to a diffusion layer in a memory cell.

2. Description of the Related Art

A basic element structure of a conventional Flash EPROM is a MOS type field effect transistor having two layer gates, in which a tunnel insulating film 1106, a floating gate 1102, an insulating film 1107, and a control gate 1103 are laminated in this order on a semiconductor substrate 1101, as shown in FIG. 1. In a program operation, electrons are caused to flow through the channel by applying a high voltage to a drain region 1104 and the control gate 1103 and connecting a source region 1105 to the ground. A program operation is executed by injecting the hot electrons generated by accelerating electrons in a high field near the drain region 1104 to the floating gate 1102. In an erase operation, the control gate 1103 is grounded and a high voltage is applied to the source region 1105, thereby applying a high voltage to a thin silicon oxide film 1106 (tunnel oxide film) between the floating gate 1102 and the source region 1105, so that Fowler-Nordheim tunneling current (FN current) is caused to flow. An erase operation is executed by extracting the electrons injected into the floating gate 1102 to the source region 1105.

However, in the above cell structure, as shown in FIG. 2, when a high voltage is applied to a source region in an erase operation, band bending occurs in a surface of a source region 1203 at a portion which overlaps a floating gate 1202. As a result, band to band tunneling occurs, and electrons 1205 and holes 1206 are generated in a depletion layer 1204. The electrons 1205 and the holes 1206 generated by the band-to-band tunneling are accelerated by a reverse biasing voltage between a source region 1201 and a substrate 1208 and cause impact ionization, thereby generating a number of carriers in the source region 1201. The carriers thus generated flow as a current between the source region 1201 and the substrate 1208. If the impurity concentration of the source region is uniform, when a gate-source voltage VGS is maintained on a level required for the erase operation as shown in FIG. 3, the band-to-band tunneling current greatly depends on the potential difference between the source region and the substrate, in a case where the potential difference is smaller than 3 V. The potential difference between the source region and the substrate does not greatly depend on the structure, such as the concentration profile of the diffusion layer of the source region, but is considered to be determined by a silicon band gap. This matter is reported by, for example, K. T. San et al. (IEEE Transaction on Electron Device, vol. 42, No. 1, page 150, 1995).

Part of the holes 1206 generated by the band to band tunneling are injected into an oxide film 1207 in an erase operation. After program erase cycles, a very small leakage current flows in the oxide film even in a low electric field. In this case, if the memory device is left for a long time, various problems may occur, e.g., lost of the electrons in the floating gate, resulting in a malfunction of the memory device.

One of the methods for reducing the band-to-band tunneling current under the constant voltage applied across the floating gate and the source region is to attenuate a lateral field in an erase operation by means of a double diffused junction structure, in which the source region is constituted by an N-type low concentration impurity region and an N-type high concentration impurity region, as shown in FIG. 4. This method, however, is disadvantageous in that, since the source region is deep, the gate length of the cell transistor cannot be scaled down.

Another method for reducing the band-to-band tunneling current is to set the source voltage to, for example, 2 V, utilizing the characteristic that the band-to-band tunneling current is markedly reduced, as shown in FIG. 3, in a region where the source-substrate voltage is smaller than 2.5 V. However, if the source voltage is simply lowered, a high negative voltage must be applied to the control gate in order to maintain a practically sufficient erasing speed. For example, if the source voltage is 2 V, a negative voltage of $-13$ V must be applied to the control gate. In general, a negative voltage applied to a gate is generated by a booster circuit in a chip. Therefore, to increase the voltage to be applied to the gate, the space occupied by the booster circuit must inevitably be increased. In addition, the transistor for driving the control gate must have a high breakdown voltage. Since the gate oxide film must be accordingly thick, the performance of the transistor is lowered, resulting in an increase in access time. Although the case of extracting electrons from the floating gate into the source region has been described above, the same problems occur in a case of extracting electrons into the drain region.

Besides the method of extracting electrons into the diffusion layer of the source or drain region, electrons can be extracted into the overall surface region of the channel. FIG. 5 shows a structure for extracting electrons into the surface region of a channel. A cell region is formed in a P-type impurity region 1402 formed in an N-type silicon substrate 1401. A high voltage is applied across the control gate 1405 and each of the N-type silicon substrate 1401, the P-type impurity region 1402, and source and drain regions 1403 and 1404, thereby extracting electrons into the overall surface region of the channel. The above method is disclosed by T. Jinbo et al. (ISSCC Digest of Technical Papers, page 155, 1992). In this method, however, as reported by H. Kume et al., since electrons pass through the overall surface region of the channel, an interface state is generated in an oxide film adjacent to the channel region by repeated program erase cycles. Therefore, the current drivability of the transistor is lowered (Symp. on VLSI Technology, Dig. of Technical Papers, Page 77, 1991).

As has been described above, the conventional Flash EPROM has a drawback that an excessive band-to-band tunneling current flows in an erase operation, and to suppress the band-to-band tunneling current, the performance of a memory cell is degraded.

SUMMARY OF THE INVENTION

It is accordingly an object of the present invention to provide a nonvolatile semiconductor memory device of a high performance and a high reliability, which suppresses an influence to a memory cell or a peripheral circuit to a minimum and reduces the band-to-band tunneling current in a memory cell in an erase operation.

The above object of the present invention is achieved by a nonvolatile semiconductor memory device comprising: a semiconductor substrate of a first conductivity type; a first impurity region of a second conductivity type formed on a surface of the semiconductor substrate; a second impurity region of the first conductivity type formed in the first impurity region of the second conductivity type; a gate oxide film formed on a surface of the second impurity region of the first conductivity type; a floating gate formed on the gate oxide film; an insulting film formed on the floating gate; a control gate formed on the insulating film; source and drain regions of the second conductivity type formed in the second impurity region of the first conductivity type; and voltage supplying means for discharging the floating gate, the voltage supplying means being controlled such that the semiconductor substrate is grounded and a potential difference between one of the source and drain regions and the second impurity region of the first conductivity type is greater than 0 V and smaller than 2.5 V.

With the above structure of the present invention, the band-to-band tunneling current can be reduced in an erase operation. As a result, the current driving capacity of the booster circuit for generating a voltage applied to the source or drain region is not lowered. At the same time, even if program erase cycles are repeated, the tunnel oxide film is prevented from degradation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit block diagram showing a first example of the voltage supply system shown in FIG. 6;

FIG. 8 is a circuit diagram showing an example of the booster circuit shown in FIG. 7;

FIG. 13 is a circuit diagram showing an example of the voltage regulation circuit shown in FIG. 12;

FIG. 14 is a circuit block diagram showing a second example of the voltage supply system shown in FIG. 6;

FIG. 15 is a circuit diagram showing an example of the voltage regulation circuit shown in FIG. 14; and FIG. 16 is a table showing voltages applied to the respective elements in the embodiments 1 to 4.

DETAILED DESCRIPTION OF THE PREFERRED EMBODIMENTS

Figure 1:
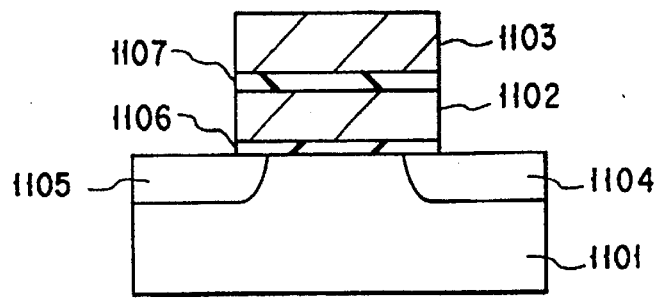
FIG. 1 is a cross-sectional view of a conventional Flash EPROM cell.
Figure 2:
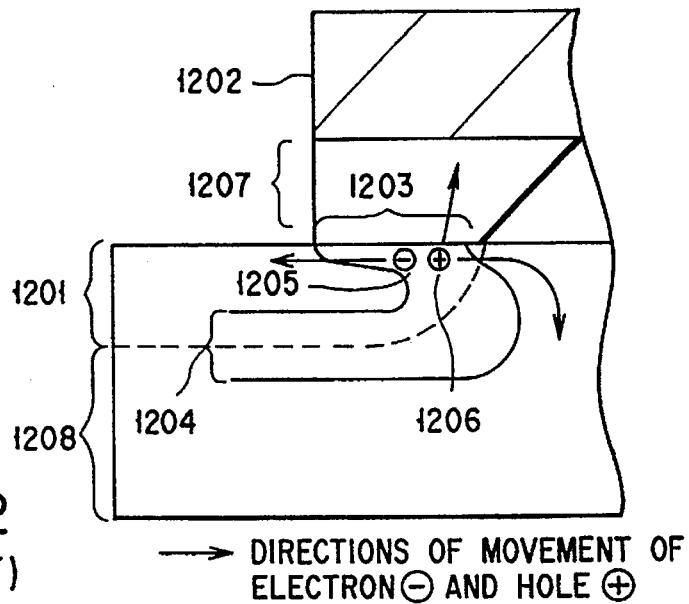
FIG. 2 is a diagram showing generation of a band-to-band tunneling current.
Figure 3:
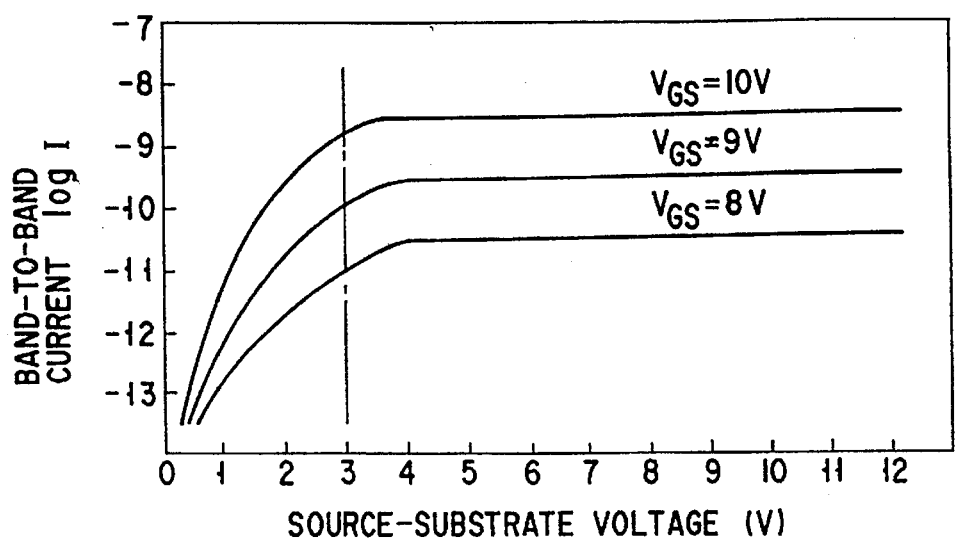
FIG. 3 is a diagram showing the relationship between the source-substrate voltage and the band-to-band tunneling current.
Figure 4:
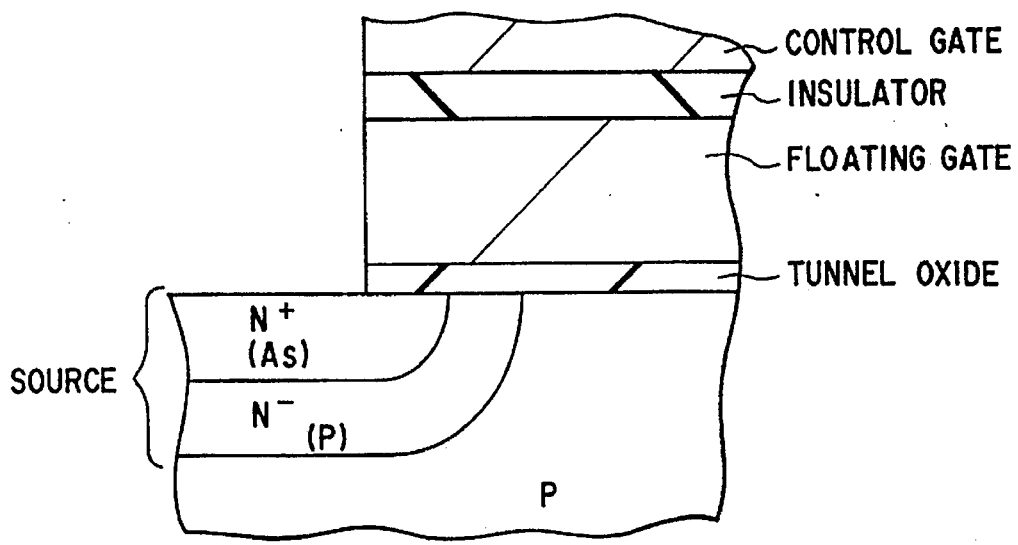
FIG. 4 is a cross-sectional view of part of a Flash EPROM cell in which the source region has a double diffused junction structure.
Figure 5:
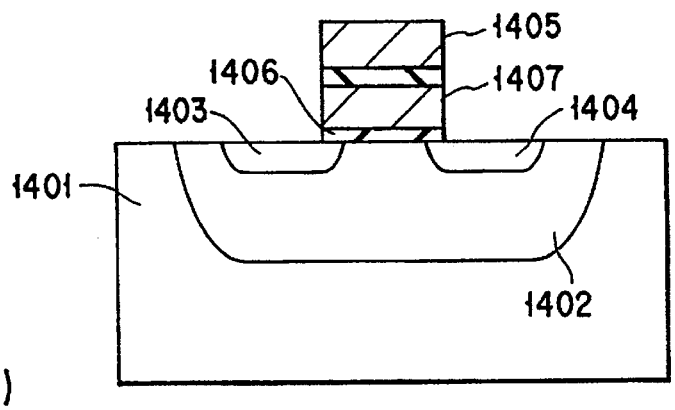
FIG. 5 is a cross-sectional view of a Flash EPROM cell having a well structure.
Figure 6:
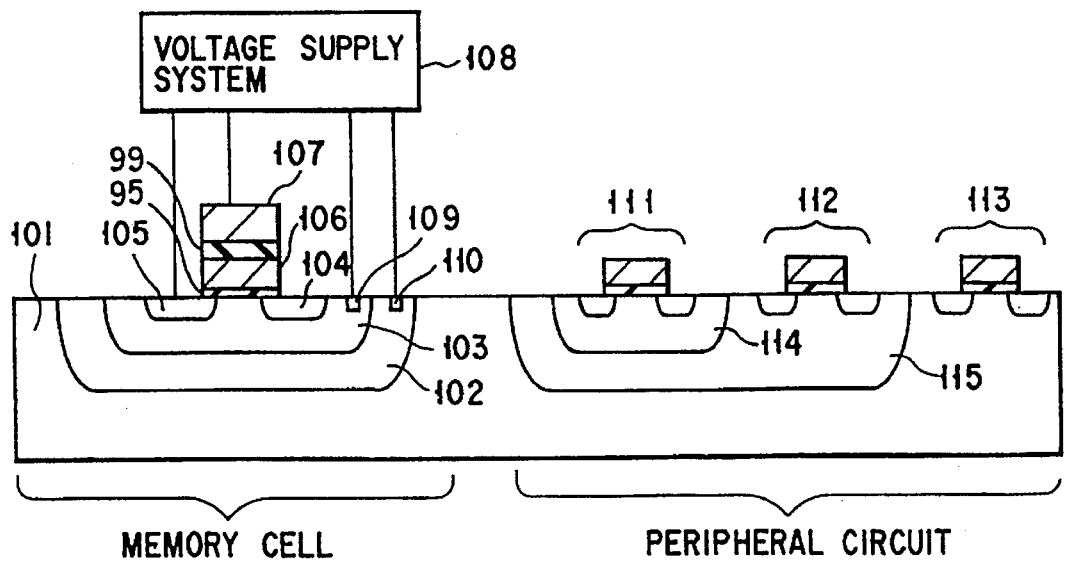
FIG. 6 is a cross-sectional view of main part of a Flash EPROM according to the present invention.

FIG. 6 is a cross-sectional view showing main part of a NOR type Flash EPROM to which the present invention is applied. An N-type impurity region 102 is formed in a P-type Si substrate 101. A P-type impurity region 103 is formed in the N-type impurity region 102. A source region 105 and a drain region 104 are formed in the P-type impurity region 103. A tunnel oxide film 95, a floating gate 106, a gate insulating film 99 and a control gate 107 are laminated in this order on a portion of the substrate between the source region 105 and the drain region 104. The N-type impurity region 102 can electrically isolate the P-type impurity region (P-well) 103 and the Si substrate 101. A peripheral circuit portion, including a decoder and its peripheral circuits, is formed of CMOS transistors or the like. As in the conventional device, a P-type MOS transistor 112 is formed in an N-type impurity region 115, N-type MOS transistors 113 and 111 are respectively formed in the P-type impurity region (substrate) 101 and a P-type impurity region 114. The peripheral circuits are not limited to these structures but can be variously modified. The gate insulating film 99 may be a laminated layer, formed of an oxide film, a nitride film and an oxide film laminated in this order. The N-type impurity region 102 and the P-type impurity region 103 of the memory cell can be electrically isolated from each other by individually applying voltages to the N-type impurity region 115 and the P-type impurity region 114 of the peripheral circuit portion.

A method for extracting electrons from the memory cell having the aforementioned device structure will now be described. A voltage set by the voltage supply system 108 is applied to the N-type impurity region 102, the P-type impurity region 103, the source region 105 and the control gate 107. Injection of electrons into the floating gate is generally performed by hot electron injection, in which a voltage is applied to the drain region 104 and the control gate 107 to generate channel hot electrons. In the following embodiments, it is assumed that the insulating film 99 between the floating gate 106 and the control gate 107 is 15 nm thick and the tunnel oxide film 95 between the channel and the floating gate 106 is 10 nm thick. However, the thickness can be varied depending on the design or specification.

First Embodiment

It is assumed an external source voltage $V_{CC}$ is 3 V. When electrons are extracted from the floating gate 106 into the source region 105, a positive boosted voltage $V_{PP}$ (e.g., 5 V) is applied to the source region 105 and the source voltage $V_{CC}$ (3 V) is applied through a high-concentration impurity region 109 to the P-type impurity region 103 on which a memory cell is formed. A voltage of −10 V is applied to the control gate 107. In this case, since the potential difference between the source region 105 and the P-type impurity region 103 is 2.0 V, which is greater than 0 V and smaller than 2.5 V, the band-to-band tunneling current can be greatly reduced as compared to that in the conventional method. At the same time, the source voltage $V_{CC}$ (3 V) is applied through a high-concentration impurity region 110 to the N-type impurity region 102 in which the P-type impurity region 103 is formed. As a result, the P-type impurity region 103 and the Si substrate 101 can be electrically isolated from each other. For this reason, the Si substrate 101 can be kept at the ground potential. Therefore, when a semiconductor chip is mounted on a base (a chip mounting portion of a lead frame), insulating paste need not be used. Thus, the chip can be attached tight to the heat-radiating base, which is fixed to the ground potential. As a result, heat generated during the operation of the memory cell can be efficiently radiated, thereby preventing increase in the temperature of the chip. Accordingly, the area of the charge pump circuit in the peripheral circuit portion can be small.

Since the P-type impurity region 103 and the N-type impurity region 102 have a large area relative to the substrate, the parasitic capacitance is also great. According to the conventional art, therefore, it is necessary to apply a voltage to these impurity regions via a charge pump circuit having a sufficiently large area to perform current charging. In contrast, according to the present invention, since the external source voltage $V_{CC}$ can be directly applied to these impurity regions, it is unnecessary to increase the area of the charge pump circuit.

In addition, according to the present invention, since the source region can be set to a relatively high potential, 5 V, the negative potential applied to the control gate 107 can be as low as, for example, $-10$ V, in an erase operation to obtain a practically sufficient erase speed. The voltage of $-10$ V applied to the control gate is required to supply a current only to charge the control gate. Therefore, the power consumption is less and the area occupied by the charge pump circuit can be smaller as compared to the conventional device. In the conventional device, in which the P-type impurity region is grounded, since a voltage of, for example, $-13$ V is applied to the gate, the withstand voltage of a peripheral transistor must be relatively high. In this case, the performance of the peripheral transistor is degraded.

To reduce the band-to-band current, it is desirable that the potential difference between the source region and the P-type impurity region 105 be set as small as possible, approximate to 0 V. However, when the potential difference is approximate to 0 V, electrons begin to be extracted into the channel. When the potential difference is 0 V, electrons cannot be extracted into the source region 105. When electrons are extracted into the channel, the cell transistor is degraded due to program erase cycles, as described before in the section of the prior art.

Figure 9:
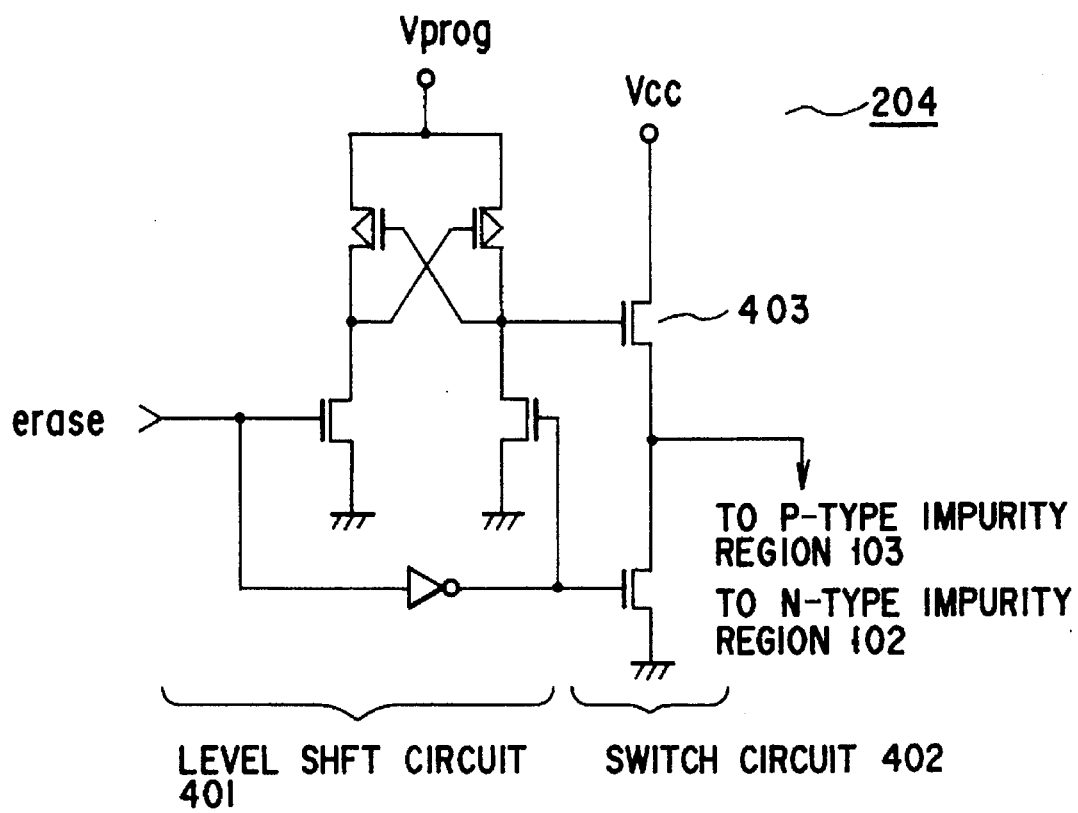
FIG. 9 is a circuit diagram showing an example of the switch unit shown in FIG. 7.

The voltage supply system 108 will now be described with reference to FIG. 7. The voltage supply system 108 comprises a pad 205 for supplying a source voltage $V_{CC}$ (e.g., 3 V), a booster circuit 201 connected to the pad 205, a switch unit 204, and a word line driving circuit 202 and a source line driving circuit 203, which are connected to the booster circuit 201 and an address data supply line. The voltage supply system 108 supplies a voltage corresponding to an operation of the Flash EPROM to the control gate 107, the P-type impurity region 103, the N-type impurity region 102 and the source region 105. As shown in FIG. 8, the booster circuit 201 comprises a ring oscillator and a charge pump circuit, which are conventionally used. When the source voltage is input to the booster circuit, it is boosted in accordance with the capacity of the charge pump circuit. The booster circuit generates a sufficiently high voltage $V_{prog}$ (10 V) to be applied to the control gate 107 in programming. The switch unit 204 comprises, as shown in FIG. 9, a level shift circuit 401 and a switch circuit 402. It reliably supplies the ground potential or source potential to the P-type and N-type impurity regions 103 and 102 in response to an erase signal generated in response to a signal supplied from an external device (or an erase signal directly supplied from an external device). In particular, the switch circuit 402 has a circuit configuration such that a boosted voltage $V_{prog}$ higher than the source voltage $V_{CC}$ is supplied in from the booster circuit 201 to the gate of an N-type transistor 403 of the switch circuit 402 in an erase operation (for example, when the erase signal is HIGH). Therefore, it is assured that the source voltage is supplied to the P-type and N-type impurity regions 103 and 102, without an influence of the threshold voltage drop of the transistor.

Figure 10:
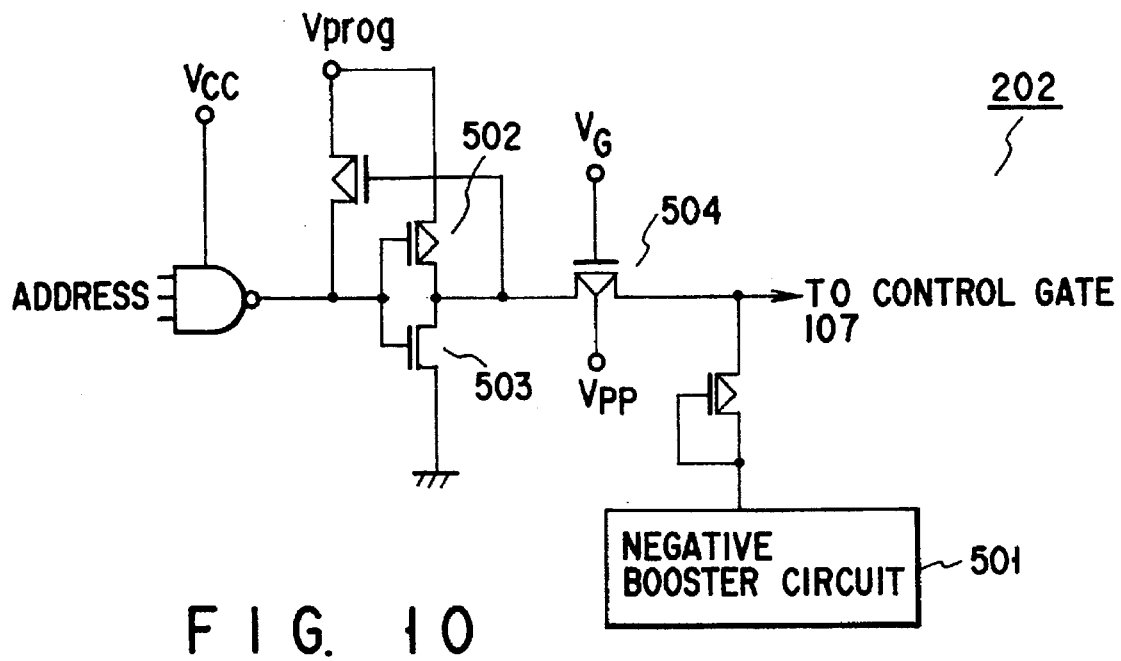
FIG. 10 is a circuit diagram showing an example of the word line driving circuit shown in FIG. 7.

FIG. 10 shows an example of the word line driving circuit in detail. Transistors 502 and 503 are turned on and off by address data. In accordance with the address data, the word line driving circuit supplies to the control gate 107, a voltage $V_{prog}$ (e.g., 10 V) in a program operation, and a negative high voltage $V_{erase}$ (e.g., $-10$ V) in an erase operation, to ensure a sufficiently high erase speed in accordance with the erase signal. A gate voltage $V_G$ of a transistor 504 is turned off by $V_{PP}$ in an erase operation. In the other operations, a potential of, for example, $-3$ V, is supplied to the gate to turn on the transistor.

Figure 11:
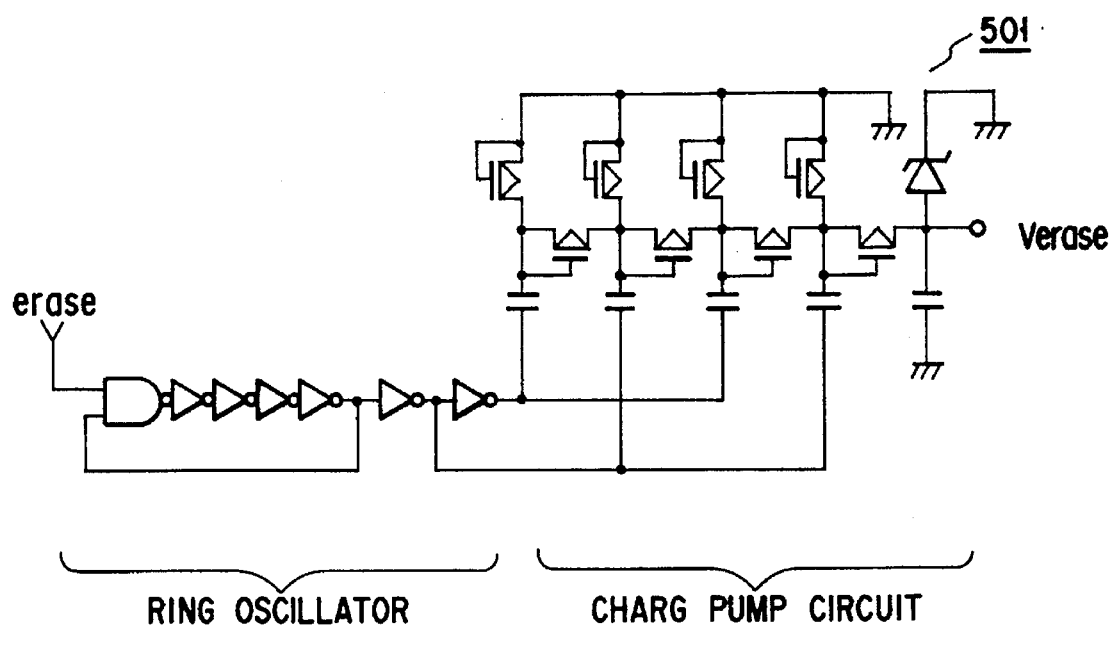
FIG. 11 is a circuit diagram showing an example of the negative booster circuit shown in FIG. 10.

FIG. 11 shows an example of a negative booster circuit 501. The circuit 501, comprising a ring oscillator and a charge pump circuit, generates a negative high voltage $V_{erase}$ in response to the erase signal. The negative voltage (e.g., $-3$ V) to be applied to the gate of the transistor is generated in a circuit having the same configuration as that of the negative booster circuit shown in FIG. 11.

Figure 12:
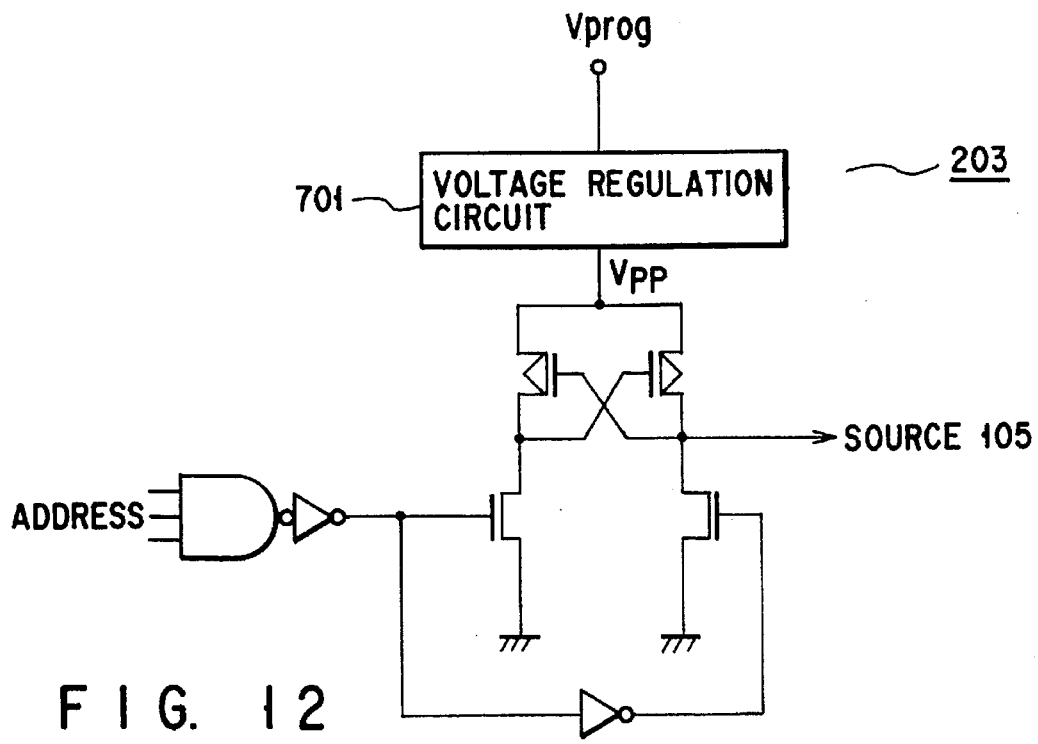
FIG. 12 is a circuit diagram showing an example of the source line driving circuit shown in FIG. 7.

FIG. 12 shows an example of the source line driving circuit 203. In accordance with the address data, the source line driving circuit supplies to the source region 105, a voltage 0 V in a program operation, and a voltage $V_{PP}$ (e.g., 5 V), regulated from the voltage $V_{prog}$ by a voltage regulation circuit 701 in an erase operation. The value of $V_{PP}$ is set such that the potential difference between $V_{CC}$ and the $V_{PP}$ is greater than 0 V and smaller than 2.5 V. As shown in FIG. 13, the voltage regulation circuit 701, comprising N-channel transistors, regulates $V_{prog}$ (e.g., 10 V) and generates $V_{PP}$ (e.g., 5 V). In this case, since the source region voltage $V_{PP}$ is first boosted and then regulated, it is constant irrespective of a change in the source voltage $V_{CC}$. Therefore, the change in erase speed due to a change in source voltage is suppressed, which allows a stable operation.

In the first embodiment of the circuit configuration shown in FIG. 7, the external source voltage $V_{CC}$ is directly applied to the P-type impurity region 103. However, it is unnecessary to do so, if a higher external voltage, e.g., 5 V is used. A second embodiment, in which an external voltage of 5 V is used, will be described below.

Second Embodiment

It is assumed that an external power source $V_{CC}$ is 5 V. In this embodiment, the external power source of 5 V is lowered to, for example, 3 V, by an internal voltage regulation circuit so that the potential difference between $V_{CC}$ and the lowered voltage is greater than 0 V and smaller than 2.5 V. The lowered voltage is applied to the P-type impurity region 103 and the N-type impurity region 102. The external source voltage of $V_{CC}$ of 5 V is directly applied to the source region. In this potential supply method, the drawbacks of the conventional art can be eliminated. The other structures and operations of the second embodiment are the same as those of the first embodiment.

Third Embodiment

The voltage supply system 108 shown in FIG. 6 is replaced by a system as shown in FIG. 14. The voltage supply system 108 comprises a pad 205 for supplying a source voltage $V_{CC}$ (e.g., 5 V), a booster circuit 201 and a voltage regulation circuit 901 connected to the pad 205, a word line driving circuit 202 and a source line driving circuit 203 which are connected to the booster circuit 201 and an address data supply line, and a switch unit 204 connected to the voltage regulation circuit 901. The voltage supply system 108 supplies a voltage corresponding to an operation of the Flash EPROM to the control gate 107, the P-type impurity region 103, the N-type impurity region 102 and the source region 105. As shown in FIG. 15, the voltage regulation circuit 901, comprising N-channel transistors, lowers the voltage $V_{CC}$ (5 V) and generates a voltage $V_{well}$ of such a value (e.g., 3 V) that the potential difference between the voltage $V_{well}$ and the voltage $V_{PP}$ (e.g., 5 V) applied to the source region in an erase operation is greater than 0 V and smaller than 2.5 V. The switch unit 204 allows reliable supply of the ground potential or $V_{well}$ to the P-type and N-type impurity regions 103 and 102. The other operations are the same as those in the first embodiment. By the same operation as that of the source line driving circuit 203, the voltage applied to the source region in the erase operation is constant irrespective of a change in the source voltage $V_{CC}$. Thus, the change in erase speed due to a change in external source voltage is suppressed. In the second embodiment, if the external source voltage $V_{CC}$=5 V is directly applied to the source region 105, a change in the external source voltage will accordingly cause a change in the source voltage, and moreover, a voltage drop may occur in the internal circuit. In the third embodiment, having the structure as shown in FIG. 14, achieves more stable power supply as compared to the second embodiment.

FIG. 16 is a table showing the above-described first to third embodiments. The table also shows a fourth embodiment in which two types of external power sources (e.g., 1.8 V and 3 V) are used. In the fourth embodiment, the potential difference between the source region and the P-well region is 1.2 V.

In the above embodiments, electrons are extracted into the source region 105. In a case of extracting electrons into the drain region 104, the first to fourth embodiments can apply if the source and drain regions are exchanged. The control gate is formed of a gate electrode in the embodiments; however, it can be formed of a diffusion layer. Electrons are injected by hot electron injection in the embodiments; however, the present invention can be applied to a device using tunnel current injection through the overall surface of the channel. However, the present invention can be more advantageous by using the channel hot electron injection, from the viewpoint of suppressing the degradation of a transistor due to a low voltage operation of the peripheral circuit portion or repeated program erase cycles.

According to the present invention, when electrons are discharged from the floating gate into the source or drain region, the amount of band-to-band tunneling current flowing from the source or drain region to the substrate can be reduced, while the general cost in relation to the design of peripheral circuits is suppressed to minimum. The reduction of band-to-band tunneling current reduces the current driving capacity required for the booster circuit and also reduces the amount of trapped charge in the oxide film formed by the band-to-band tunneling current. Thus, the reliability of the memory cell is increased. In addition, since electrons are extracted into the source or drain region, even if program erase cycles are repeated, the cell transistor may be less degraded as compared to the case in which electrons are extracted into the overall surface of the channel.

Moreover, since the potential difference between the channel region and the source or drain region is small, the double diffused junction structure of an N-type low-concentration impurity region and an N-type high-concentration impurity region, which has been conventionally used in a source region, is not necessarily required. As a result, the cell transistor can be refined, and in particular, the gate length can be reduced. If a cell transistor is more and more refined, the absolute value of a high voltage generated in a program or erase operation can be reduced, which contributes to reduction of the area of the charge pump circuit. Therefore, the insulating film between the floating gate and the control gate and the tunnel oxide film between the channel and the floating gate are tending to be thinner than 15 nm and 10 nm assumed in the above embodiments.

Furthermore, since the double well structure of a P-type first impurity region and an N-type second impurity region is used, the impurity region on which the memory cell is formed is electrically isolated from the semiconductor substrate. Therefore, the semiconductor substrate can be kept to the ground potential. As a result, the heat radiation efficiency, when the semiconductor chip is mounted on the base, can be improved.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defied by the appended claims and their equivalents.

What is claimed is:

1. A nonvolatile semiconductor memory device comprising:

a semiconductor substrate of a first conductivity type;

a first impurity region of a second conductivity type formed on a surface of the semiconductor substrate;

a second impurity region of the first conductivity type formed in the first impurity region of the second conductivity type;

a gate oxide film formed on a surface of the second impurity region of the first conductivity type;

a floating gate formed on the gate oxide film;

an insulting film formed on the floating gate;

a control gate formed on the insulating film;

source and drain regions of the second conductivity type formed in the second impurity region of the first conductivity type; and voltage supplying means for discharging the floating gate, the voltage supplying means being controlled such that the semiconductor substrate is grounded and a potential difference between one of the source and drain regions and the second impurity region of the first conductivity type is greater than 0 V and smaller than 2.5 V.

2. A nonvolatile semiconductor memory device comprising:

a semiconductor substrate of a first conductivity type;

a first impurity region of a second conductivity type formed on a surface of the semiconductor substrate;

a second impurity region of the first conductivity type formed in the first impurity region of the second conductivity type;

a gate oxide film formed on a surface of the second impurity region of the first conductivity type;

a floating gate formed on the gate oxide film;

an insulting film formed on the floating gate;

a control gate formed on the insulating film;

source and drain regions of the second conductivity type formed in the second impurity region of the first conductivity type; and voltage supplying means for discharging the floating gate, the voltage supplying means being controlled such that the semiconductor substrate is grounded, a potential difference between one of the source and drain regions and the second impurity region of the first conductivity type is greater than 0 V and smaller than 2.5 V, and voltages a, b, c and d respectively supplied to the control gate, the second impurity region, the semiconductor substrate, and one of the source and drain regions have a relationship of d>b>c>a.

3. The nonvolatile semiconductor memory device according to claim 1 or 2, wherein the voltage supplying means include a structure for supplying a voltage of the same potential as that in the second impurity region of the first conductivity type to the first impurity region of the second conductivity type, when the floating gate is discharged.

4. The nonvolatile semiconductor memory device according to claim 1 or 2, wherein the voltage supplying means comprise:

a booster circuit for boosting a source voltage;

a level shift circuit connected to the booster circuit; and a switch circuit for supplying, in accordance with an output of the level shift circuit, a voltage corresponding to the source voltage to the second impurity region through an impurity region of the first conductivity type of a concentration higher than that of the second impurity region.

5. The nonvolatile semiconductor memory device according to claim 4, wherein the voltage corresponding to the source voltage is supplied, by means of the switch circuit, not only to the second impurity region but also to the first impurity region through an impurity region of the second conductivity type of a concentration higher than that of the first impurity region.

6. The nonvolatile semiconductor memory device according to claim 1 or 2, wherein the voltage supplying means comprise:

a booster circuit for boosting a source voltage;

a voltage regulation circuit for lowering the source voltage;

a level shift circuit connected to the booster circuit; and a switch circuit for supplying, in accordance with an output of the level shift circuit, a voltage lowered from the source voltage by the voltage regulation circuit, to the second impurity region through an impurity region of the first conductivity type of a concentration higher than that of the second impurity region.

7. The nonvolatile semiconductor memory device according to claim 6, wherein the voltage lowered from the source voltage by the voltage regulation circuit is supplied, by means of the switch circuit, not only to the second impurity region but also to the first impurity region through an impurity region of the second conductivity type of a concentration higher than that of the first impurity region.

8. The nonvolatile semiconductor memory device according to claim 1 or 2, further comprising means for grounding the semiconductor substrate in all operation modes of the nonvolatile semiconductor memory device.

9. The nonvolatile semiconductor memory device according to claim 1 or 2, wherein charges are injected into the floating gate by hot electron injection.

10. The nonvolatile semiconductor memory device according to claim 1 or 2, wherein the voltage supplying means comprise:

a booster circuit for boosting a source voltage;

a level shift circuit connected to the booster circuit;

a switch circuit for supplying, in accordance with an output of the level shift circuit, a voltage corresponding to the source voltage to the second impurity region through an impurity region of the first conductivity type of a concentration higher than that of the second impurity region;

a word line driving circuit, connected to the booster circuit, for supplying to the control gate, a positive high potential for programming in a program operation and a negative high potential for erasing in an erase operation, in accordance with address data and an erase signal; and a source line driving circuit, connected to the booster circuit, for supplying to one of the source and drain regions, a potential of 0 V in said program operation and a potential lowered by an internal voltage regulation circuit, in accordance with address data.

11. The nonvolatile semiconductor memory device according to claim 1 or 2, wherein the voltage supplying means comprise:

a booster circuit for boosting a source voltage;

a voltage regulation circuit for lowering the source voltage;

a level shift circuit connected to the booster circuit;

a switch circuit for supplying, in accordance with an output of the level shift circuit, a voltage lowered from the source voltage by the voltage regulation circuit, to the second impurity region through an impurity region of the first conductivity type of a concentration higher than that of the second impurity region;

a word line driving circuit, connected to the booster circuit, for supplying to the control gate, a positive high potential for programming in a program operation and a negative high potential for erasing in an erase operation, in accordance with address data and an erase signal; and a source line driving circuit, connected to the booster circuit, for supplying to one of the source and drain regions, a potential of 0 V in said program operation and a potential lowered by an internal voltage regulation circuit in said erase operation, in accordance with address data.

12. The nonvolatile semiconductor memory device according to claim 1 or 2, wherein the voltage supply means generate a Fowler-Nordheim tunneling current which flows through the gate oxide film, and extract electrons from the floating gate into one of the source and drain regions.

* * * * *